US008679949B2

(12) United States Patent
Park et al.

(10) Patent No.: US 8,679,949 B2
(45) Date of Patent: Mar. 25, 2014

(54) SILICON NANOWIRE COMPRISING HIGH DENSITY METAL NANOCLUSTERS AND METHOD OF PREPARING THE SAME

(75) Inventors: Gyeong-su Park, Suwon-si (KR); In-yong Song, Suwon-si (KR); Sung Heo, Suwon-si (KR); Dong-wook Kwak, Seongnam-si (KR); Hoon Young Cho, Seongnam-si (KR); Han-su Kim, Seoul (KR); Jae-man Choi, Hwaseong-si (KR); Moon-seok Kwon, Hwaseong-si (KR)

(73) Assignees: Samsung Electronics Co., Ltd. (KR); Dongguk University Industry-Academic Cooperation Foundation (KR)

( * ) Notice: Subject to any disclaimer, the term of this patent is extended or adjusted under 35 U.S.C. 154(b) by 29 days.

(21) Appl. No.: 13/076,957

(22) Filed: Mar. 31, 2011

(65) Prior Publication Data

US 2011/0240954 A1    Oct. 6, 2011

(30) Foreign Application Priority Data

Apr. 2, 2010  (KR) ........................ 10-2010-0030504

(51) Int. Cl.
*H01L 21/20*        (2006.01)
(52) U.S. Cl.
USPC .. 438/478; 257/9; 257/E21.09; 257/E29.068; 977/762
(58) Field of Classification Search
USPC ................ 438/478; 257/9, E21.09, E29.068; 977/762
See application file for complete search history.

(56) References Cited

U.S. PATENT DOCUMENTS

| 7,262,463 | B2 | 8/2007 | Hoffman |
| 7,335,259 | B2 | 2/2008 | Hanrath et al. |
| 2008/0246020 | A1* | 10/2008 | Kawashima et al. ........... 257/24 |
| 2009/0201496 | A1 | 8/2009 | Lee et al. |
| 2011/0042642 | A1* | 2/2011 | Alet et al. ........................ 257/9 |

FOREIGN PATENT DOCUMENTS

| JP | 2004-269987 A | 9/2004 |
| KR | 1020040101858 A | 12/2004 |
| KR | 1020070048943 A | 5/2007 |
| KR | 1020070049035 A | 5/2007 |
| WO | 2008/081182 | 7/2008 |
| WO | 2008/156892 | 12/2008 |

OTHER PUBLICATIONS

European Search Report issued by European Patent Ofice on Jul. 6, 2011.
Dhallin et al., "Critical condition for growth of silicon nanowires", Journal of Applied Physics, vol. 102, 2007, pp. 094906-1 to 094906-5.
Silicon nanowire-based solara cells; TH Stelzner, M Pietsch, G Andra, F Falk, E Ose and S Christiansen; Nanotechnology 19 (2008) 295203 (4pp).

(Continued)

*Primary Examiner* — Kimberly Rizkallah
(74) *Attorney, Agent, or Firm* — Cantor Colburn LLP

(57) ABSTRACT

A silicon nanowire includes metal nanoclusters formed on a surface thereof at a high density. The metal nanoclusters improve electrical and optical characteristics of the silicon nanowire, and thus can be usefully used in various electrical devices such as a lithium battery, a solar cell, a bio sensor, a memory device, or the like.

8 Claims, 9 Drawing Sheets

(56) References Cited

OTHER PUBLICATIONS

Silicon nanowire oxidation: the influence of sidewall structure and gold distribution; V A Sivakov, R Scholz, F Syrowatka, F Falk, U Gosele and S H Christiansen; 2009 Nanotechnology 20 405607 (8pp).

King-Qing Peng et al., "PLatinum Nanoparticle Decorated Silicon Nanowires for Efficient Solar Energy Conversion", Nano Letters, vol. 9, No. 11, 2009, p. 3704-3709.

\* cited by examiner

SILICON NANOWIRE COMPRISING HIGH DENSITY METAL NANOCLUSTERS AND METHOD OF PREPARING THE SAME

CROSS-REFERENCE TO RELATED APPLICATIONS

This application claims priority to Korean Patent Application No. 10-2010-0030504, filed on Apr. 2, 2010, and all the benefits accruing therefrom under 35 U.S.C. §119, the content of which in its entirety is herein incorporated by reference.

BACKGROUND

1. Field

The present disclosure relates to a silicon nanowire including high density metal nanoclusters and a method of preparing the same, and more particularly, to a silicon nanowire structure including metal nanoclusters formed on a surface thereof. The metal nanoclusters are formed at a high density on the silicon nanowire surface.

2. Description of the Related Art 1-dimensional nano-structures, such as silicon nanowires, have attracted much attention as "next-generation nano materials", because a 1-dimensional nano-structure can be used in electronic devices, optical devices, bio sensors, and the like, that are nano-sized and have excellent properties.

In particular, research and studies have been conducted on a vertical-type silicon nanowire field effect transistor ("FET") that can increase the integration density and speed of a semiconductor. It can also be used in silicon nanowire lithium batteries because of the high capacity properties of silicon. The high capacity properties of silicon also make it suitable for use in solar cells.

SUMMARY

Disclosed herein is a silicon nanowire having an improved electrical conductivity and improved optical properties over other comparative silicon nanowires that do not have the same structure.

Disclosed herein too is a method of preparing the silicon nanowire.

Disclosed herein too are various applications for the silicon nanowire.

Additional aspects will be set forth in part in the description which follows and, in part, will be apparent from the description, or may be learned by practice of the presented embodiments.

According to an aspect of the present invention, a silicon nanowire includes metal nanoclusters, which are formed on a surface of the silicon nanowire.

The metal nanoclusters may have an average size of about 1 to about 10 nanometers.

The metal nanoclusters may have an average size of about 2 to about 5 nanometers.

The metal nanoclusters may be disposed at a high density on the surface of the silicon nanowire.

The metal nanoclusters may exist at a density of about $1 \times 10^6$ nanoclusters/cm$^2$ to about $1 \times 10^{16}$ nanoclusters/cm$^2$ (nanoclusters per square centimeter).

The metal nanoclusters may exist at a density of about $1 \times 10^{11}$ nanoclusters/cm$^2$ to about $1 \times 10^{13}$ nanoclusters/cm$^2$.

The metal nanoclusters may include at least one metal selected from the group consisting of a transition metal, a lanthanide, a group 13 element (with the exception of boron), and a group 14 element (with the exception of carbon and silicon).

The metal nanoclusters may include at least one metal selected from the group consisting of gold (Au), nickel (Ni), steel (Fe), silver (Ag), aluminum (Al), germanium (Ge), gadolinium (Gd), copper (Cu), indium (In), and lead (Pb).

A cross-section of the silicon nanowire may have a hexagonal structure.

An end portion of the silicon nanowire may include a metal gap having a hemispherical shape.

A diameter of the silicon nanowire may be about 10 to about 50 nanometers.

A length of the silicon nanowire may be about 0.5 to about 20 μm (micrometers).

The silicon nanowire may be obtained by rapid thermal chemical vapor deposition ("CVD"), laser thermal CVD ("LTCVD"), or metal organic CVD ("MOCVD").

According to another aspect of the present invention, disclosed herein is a method of preparing a silicon nanowire, the method including: disposing a metal thin film layer on a silicon substrate; calcining in a first calcination process, the silicon nanowires with the metal thin film layer disposed thereon in a hydrogen atmosphere to form metal silicon islands; and calcining in a second calcination process, the silicon nanowire with the metal silicon islands disposed in the presence of a mixed gas thereon to form metal nanoclusters on the silicon nanowires.

According to another aspect of the present invention, an electric device may include the silicon nanowire having disposed thereon metal nanoclusters.

The electric device may include a solar cell, lithium battery, transistor, memory device, optical sensor, bio sensor, light-emitting diode, wave guide, light-emitting device, or capacitor.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
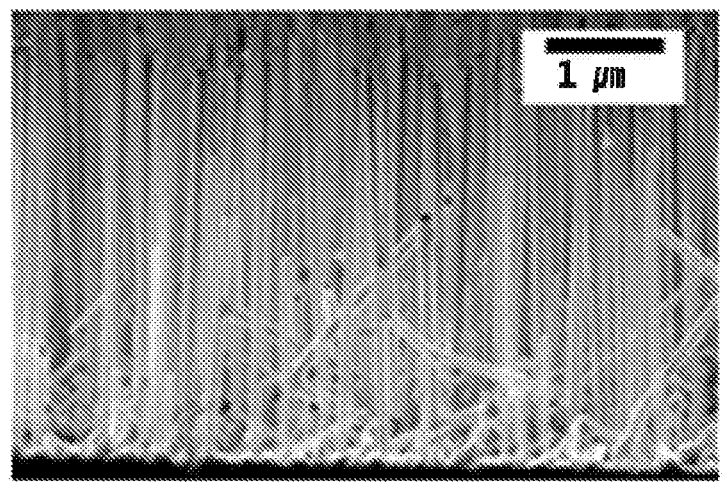
FIG. 1 shows a scanning electron microscope (SEM) micrograph of a silicon nanowire obtained in Example 1 and including gold (Au) nanoclusters disposed on a surface thereof at a high density, according to an embodiment of the present invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The present invention provides a silicon nanowire including metal nanoclusters, wherein the silicon nanowire has a heterogeneous-structure comprising at least two different materials. The silicon nanowire includes the metal nanoclusters have a structure in which the metal nanoclusters are formed on a surface of the silicon nanowire.

Various properties of the silicon nanowire, for example, a charge capacity characteristic, a charge capture characteristic, an electrical conductivity, an optical characteristic, and the like, may be improved because of the metal nanoclusters that are disposed on the silicon nanowire at a high density.

The metal nanoclusters have an electrical conductivity that is higher than the electrical conductivity of the silicon nanowire, and as a result the electrical conductivity of the silicon nanowire may be improved over a comparative silicon nanowire that does not contain the metal nanoclusters disposed thereon. Furthermore, since the metal nanoclusters are disposed on the surface of the silicon nanowires at a high density, the silicon nanowires have optical characteristics that are suitable for displaying an excellent response signal time when measured by the surface plasmon resonance of the metal nanoclusters.

The metal nanoclusters providing such characteristics to the silicon nanowire may include at least one metal selected from the group consisting of a transition metal, a lanthanide, a group 13 element (except for boron), and a group 14 element (except for carbon and silicon). For example, the metal nanoclusters may include at least one metal selected from the group consisting of gold (Au), nickel (Ni), steel (Fe), silver (Ag), aluminum (Al), germanium (Ge), gadolinium (Gd), copper (Cu), indium (In), lead (Pb and a combination comprising at least one of the foregoing metals. Among these metals, a nontoxic metal may be used as a medicine transfer material or used in biological applications, according to the purpose. For example, the nontoxic metal may be Au or Ag.

The metal nanoclusters may include a metal agglomerated in the form of a nanodot. The metal nanoclusters may have a circular shape or an irregular shape. The metal nanoclusters may have a size less than a diameter of the silicon nanowire, for example, a size less than or equal to about 500 nanometers, specifically about 5 to about 400 nanometers, and more specifically about 10 to about 300 nanometers, which is characteristic of a nanowire. For example, the metal nanoclusters may have an average size of about 1 to about 100 nanometers, specifically about 1 to about 10 nanometers, and more specifically about 2 to about 5 nanometers. When the metal nanoclusters have a circular shape, the size of the metal nanoclusters may be defined in terms of the diameter of the metal nanoclusters. On the other hand, when the metal nanoclusters have an irregular shape, the size of the metal nanoclusters may be defined in terms of the length of a major axis of the metal nanoclusters. It is desirable for the length of the major axis to be measured through the center of mass of the metal nanoclusters.

The metal nanoclusters exist on the surface of the silicon nanowire at a high density, for example, at a density of about $1\times10^6$ nanoclusters/cm$^2$ to about $1\times10^{16}$ nanoclusters/cm$^2$, specifically about $1\times10^{11}$ nanoclusters/cm$^2$ to about $1\times10^{13}$ nanoclusters/cm$^2$. As such, the metal nanoclusters existing at such a high density may be uniformly arranged, and the metal nanoclusters may be arranged at an interval of about 1 to about 100 nanometers. In one embodiment, the metal nanoclusters can be periodically arranged on the surface of the silicon nanowire. In another embodiment, the metal nanoclusters can be aperiodically arranged on the surface of the silicon nanowire.

The range of distribution, interval of arrangement, and size of the metal nanoclusters may vary according to the conditions of the manufacturing process, and may be appropriately adjusted depending upon the purpose and the application for which the silicon nanowires will be used.

Any silicon material may be used for the nanowires regardless of its shape and size. In one embodiment, amorphous silicon, crystalline silicon, or silicon comprising silica, may be used regardless of its shape and size for manufacturing the nanowires. The silicon nanowire including the metal nanoclusters according to an embodiment of the present invention may have a hexagon-shaped cross-section, and an upper end portion (of the silicon nanowire) may include a metal cap having a hemispherical shape.

The silicon nanowire may have a diameter of about 10 to about 500 nanometers and a length of about 0.5 to about 20 micrometers. In one embodiment, the diameter of the silicon nanowire is about 20 to about 400 nanometers, specifically about 50 to about 300 nanometers.

The length of the silicon nanowires may be about 1 to about 15 micrometers, specifically about 5 to about 10 micrometers. The diameter of the silicon nanowire may be measured via a cross-section that is cut perpendicularly with respect to the length of the silicon nanowire. For example, if the silicon nanowire has a hexagon-shaped cross-section, the cross-section may be measured by a length of a major axis (a line connecting corresponding vertices that is perpendicular to the length of the major axis). The diameter and length of the silicon nanowire may vary according to the conditions of a manufacturing process used for making the silicon nanowires.

The silicon nanowire including the metal nanoclusters formed on the surface thereof may be prepared by disposing a metal thin film layer on a silicon substrate under a hydrogen atmosphere and then growing the silicon nanowires thereon.

According to an embodiment of the present invention, the silicon nanowire may be prepared by disposing a metal thin film layer on a silicon substrate, disposing a metal-silicon island by performing a first calcination process on the silicon substrate with the metal thin film layer disposed thereon. The metal-silicon islands are formed in a chemical vapor deposition ("CVD") chamber in a hydrogen atmosphere. Growing of the silicon nanowire is by performing a second calcination process on the silicon substrate having the metal-silicon islands disposed thereon while injecting a mixed gas into the CVD chamber.

The metal thin film layer disposed on the silicon substrate may be a metal thin film layer that includes the metal for forming the metal nanoclusters. The metal thin film layer may include at least one metal selected from the group consisting of a transition metal, a lanthanide, a group 13 element (except for boron), a group 14 element (except for carbon and silicon), and a combination comprising at least one of the foregoing metals. For example, the metal for forming the metal nanoclusters may include at least one metal selected from the group consisting of Au, Ni, Fe, Ag, Al, Ge, Gd, Cu, In, Pb, and a combination comprising at least one of the foregoing metals.

The metal thin film layer may be disposed on the silicon substrate in a thickness of about 1 to about 100 nanometers, specifically about 1 to about 10 nanometers, by sputtering, CVD, spin coating, atomic layer deposition ("ALD"), or metal organic chemical vapor deposition ("MOCVD"). The metal thin film layer may be formed on at least one surface of the silicon substrate or may be formed on opposite surfaces of the silicon substrate.

The metal thin film layer is formed on the silicon substrate, following which the silicon nanowire is grown on the substrate. The silicon nanowire may be grown by rapid thermal chemical vapor deposition ("RTCVD"), laser thermal chemical vapor deposition ("LTCVD"), or MOCVD.

In order to grow the silicon nanowire, the silicon substrate including the metal thin film layer disposed thereon may be placed inside the CVD chamber. The CVD chamber may be a CVD chamber that uses a halogen lamp or laser.

When the first calcination process is performed in the CVD chamber, the metal and the silicon substrate react with each other, and thus metal-silicon islands is uniformly disposed on the substrate. The metal-silicon island, which is nano-sized, is a particulate material having a silicide shape.

The first calcination process may be performed under a hydrogen atmosphere, and may be performed under a vacuum atmosphere, for example, a pressure of about 0.1 to about 500 Torr. The first calcination process may be performed at a temperature of about 300 to about 1,000° C. for about 5 minutes to about one hour.

After the metal-silicon island is uniformly formed on the silicon substrate by the first calcination process, the second calcination process is performed to grow the silicon nanowire including the metal nanoclusters.

The second calcination process may be performed when the CVD chamber is maintained at a pressure of about 0.1 to about 10 torr and at a temperature of about 500 to about 600° C., while injecting a mixed gas into the CVD chamber, for about 0.1 to about 10 hours. The mixed gas may be a mixture of silicon hydride ($SiH_4$) and $H_2$. The amount of $SiH_4$ may be of about 1 to about 10 standard cubic centimeters per minute ("sccm"), and the amount of $H_2$ may be of about 10 to about 100 sccm.

After the second calcination process is performed, the silicon nanowire including the metal nanoclusters uniformly formed on the surface thereof at a high density may be obtained.

The size, degree of distribution, interval of arrangement of the metal nanoclusters or the diameter, length, and the like, of the silicon nanowire may be controlled by adjusting the pressure, temperature, stay time, and the like, of the CVD chamber during the first and second calcination processes. For example, the silicon nanowire including Au nanoclusters may be controlled by adjusting the pressure, temperature, stay time, and the like, of the CVD chamber.

After the silicon nanowire including the metal nanoclusters disposed on the surface thereof is prepared, a thermal treatment may be additionally performed on the silicon nanowire at a temperature of about 300 to about 1,000° C. for about 0.1 to about 10 hours so as to adjust the size or density of the metal nanoclusters. It is to be noted that the metal nanoclusters are disposed on the silicon nanowire and are in direct contact with the silicon nanowire.

The silicon nanowire with the metal nanoclusters disposed on the surface thereof at a high density have improved electron capture characteristics, improved electrical conductivity, and improved optical characteristics (light absorption or optical emitting) when compared with other silicon nanowires that do not have the metal clusters disposed thereon. The silicon nanowire may thus be used in various electrical devices.

The electrical devices may include a solar cell, a field effect transistor (FET), a charge trap flash (CTF) memory, an optical sensor, a bio sensor, a light-emitting diode, a surface plasmon wave guide, a photoluminescence (PL) device, a capacitor, or the like.

When the silicon nanowire having the metal nanoclusters disposed thereon is used in a bio field, the metal nanoclusters, which are appropriate for transferring bio materials or for a bio sensor, are distributed on the surface of the silicon nanowire at a high density, and thus the silicon nanowire (including the metal nanoclusters) may be used as a nano material having less toxicity compared to a conventional silicon nanowire for use in the bio field.

Furthermore, when the silicon nanowire including the metal nanoclusters are used in a lithium battery, the silicon nanowire has an excellent conductivity and has a structure in which deterioration of silicon due to charge/discharge may be reduced compared to that of a lithium battery including a comparative silicon nanowire that does not have the metal nanoclusters disposed thereon, and thus a silicon nanowire lithium battery having improved characteristics may be manufactured.

In addition, an optical device having an excellent response signal time may be manufactured due to surface plasmon resonance of the high density metal nanoclusters, which are over-saturated on the surface of the silicon nanowire. A charge trap characteristic of the metal nanoclusters may be applied to a device through a simple process to allow the device to have an excellent charge trap characteristic, compared to a CTF flash memory manufactured through a conventional thin film manufacturing process.

Hereinafter, the present invention may be described with reference to following Examples, but the following Examples are intended to describe, but not limit, the invention.

EXAMPLE

Example 1

A gold (Au) thin film layer having a thickness of 1.0 to 1.5 nanometers was deposited by sputtering on a silicon (100) substrate having a size of 1.0×1.0 nanoclusters/cm² and a thickness of 700 micrometers.

The silicon substrate on which the Au thin film layer is formed was moved to a RTCVD chamber including a halogen lamp, and then a calcination process was performed within the chamber under a hydrogen atmosphere at a pressure of 0.5 Torr and a temperature of 700° C. for 10 minutes so as to form Au-silicon islands having a diameter of 50 to 150 nanometers.

After the Au-silicon islands were formed, a mixed gas of $SiH_4$ (2 sccm) and $H_2$ (50 sccm) was injected into the chamber while maintaining the pressure and temperature of the chamber at 0.5 Torr and 550° C., respectively, so as to grow a silicon nanowire, thereby preparing the silicon nanowire including Au nanoclusters formed on a surface thereof. The number density of Au nanoclusters on the Si-nanowire sidewalls is at least $3 \times 10^{12}$ cm$^{-2}$. If we assume that the Au nanoclusters are spherical in shape, and that the average size is 4 nm, we can estimate that approximately 37% of the entire Si-nanowire surface is covered with Au nanoclusters. This density was measured by high-angle annular dark field scanning transmission electron microscopy tomography FIG. 1 is a scanning electron microscope (SEM) image of the silicon nanowire including the Au nanoclusters formed on the surface thereof, obtained by the above method. As illustrated in FIG. 1, the silicon nanowire has a diameter of about 30 to about 100 nanometers and a length of about 0.5 to about 12 micrometers.

Figure 2A:
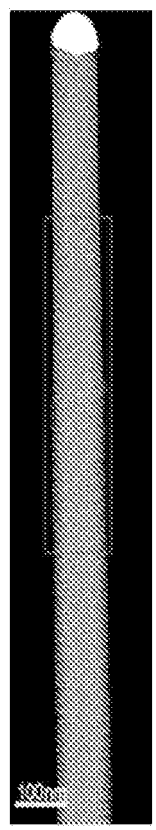
FIG. 2A shows an enlarged image of a micrograph of the silicon nanowire obtained in Example 1 and including the Au nanoclusters disposed on the surface thereof at a high density.

FIG. 2A is a Z-contrast image of one silicon nanowire including the Au nanoclusters formed on the surface thereof at a high density. The silicon nanowire has a uniform thickness.

Figure 2B:
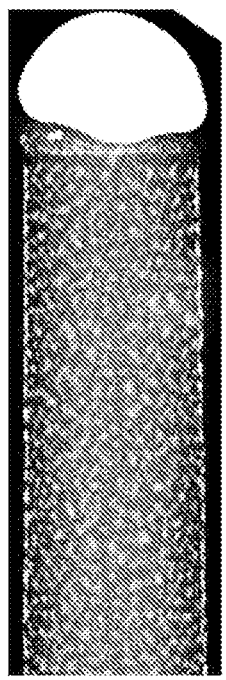
FIG. 2B is a partial enlarged micrographic image of an upper part of the silicon nanowire obtained in the Example 1, which includes the Au nanoclusters disposed on the surface thereof at a high density.

FIG. 2B a partial enlarged image of an upper part of the silicon nanowire of FIG. 2A including the Au nanoclusters formed at a high density on the surface thereof. The Au nanoclusters each having a size of about 2 to about 5 nanometers are uniformly distributed on the entire surface of the silicon nanowire, and a hemispherical cap formed of Au is formed on the upper part of the silicon nanowire.

Figure 2C:
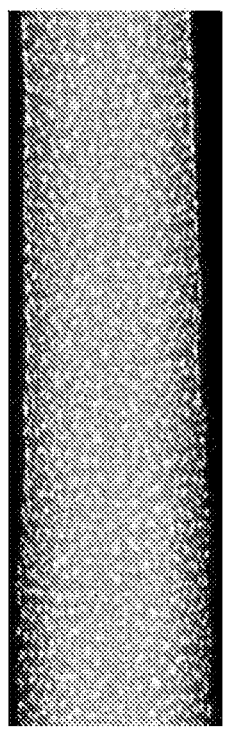
FIG. 2C is a partial enlarged micrographic image of a central part of the silicon nanowire obtained in the Example 1, which includes the Au nanoclusters disposed on the surface thereof at a high density.

FIG. 2C is a partial enlarged image of a central part of the silicon nanowire, and the Au nanoclusters each having a size of about 2 to about 5 nanometers are uniformly distributed on the entire surface of the silicon nanowire.

Figure 3A:
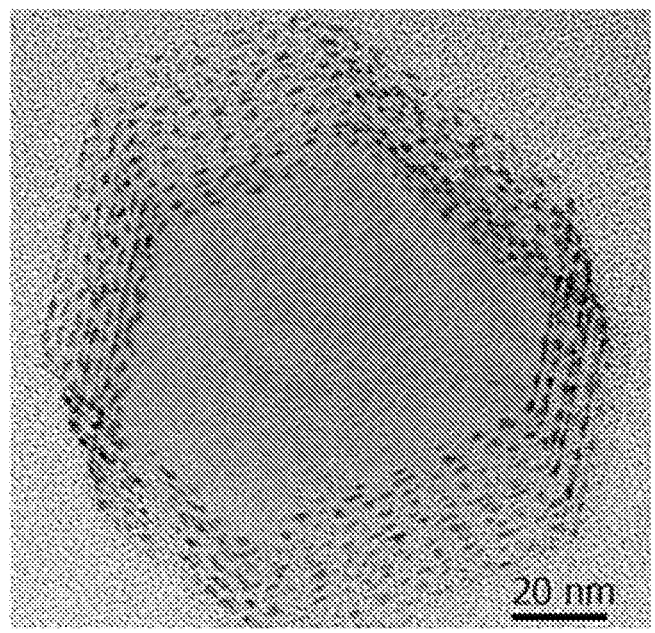
FIG. 3A shows a transmission electron microscopy (TEM) micrograph of a cross-section of the silicon nanowire obtained in Example 1, which includes the Au nanoclusters disposed on the surface thereof at a high density.

FIG. 3A is a transmission electron microscopy (TEM) image of a cross-section of the silicon nanowire of Example 1 including the Au nanoclusters formed on the surface thereof.

Figure 3B:
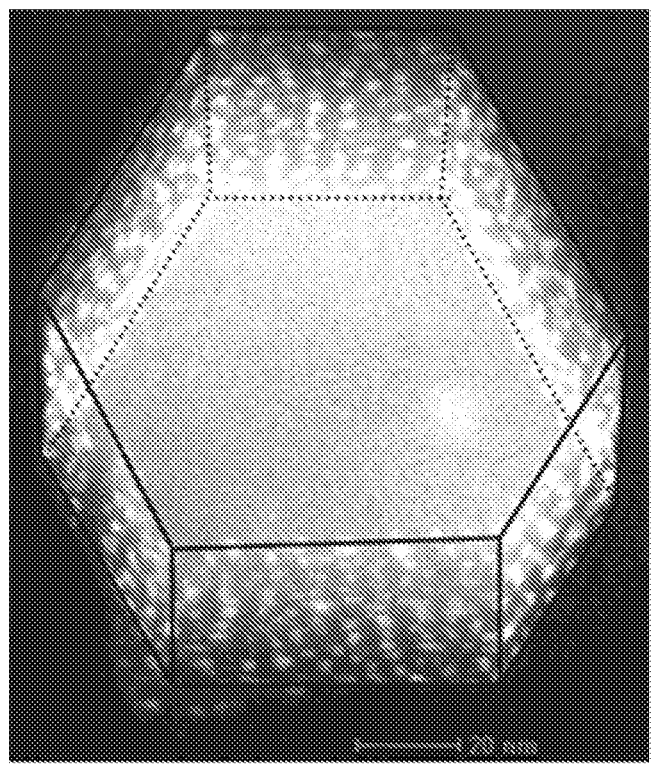
FIG. 3B shows a Z-contrast (STEM) image of a cross-section of the silicon nanowire obtained in Example 1, which includes the Au nanoclusters disposed on the surface thereof at a high density.

FIG. 3B is a Z-contrast image showing a hexagon-shaped cross-section of the silicon nanowire, where the Au nanoclusters are uniformly distributed at a predetermined interval only on the surface of the silicon nanowire.

Determining the density of the Au nanoclusters by using a three-dimensional (3D) tomography technique, the Au nanoclusters were determined to exist at a density of about $3.2\times 10^{12}$ nanoclusters/cm$^2$ on the surface of the silicon nanowire.

Figure 4A:
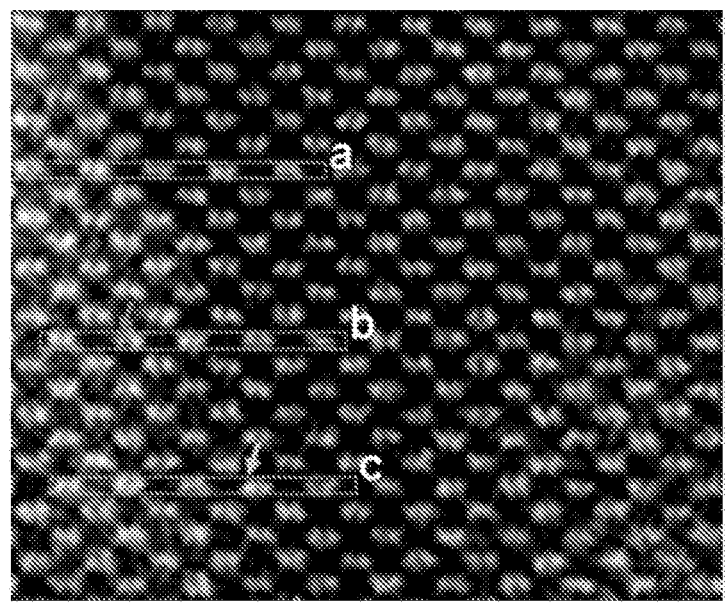
FIG. 4A shows a high-resolution Z-contrast image of the Au nanoclusters, which includes in the silicon nanowire obtained in the Example 1.
Figure 4B:
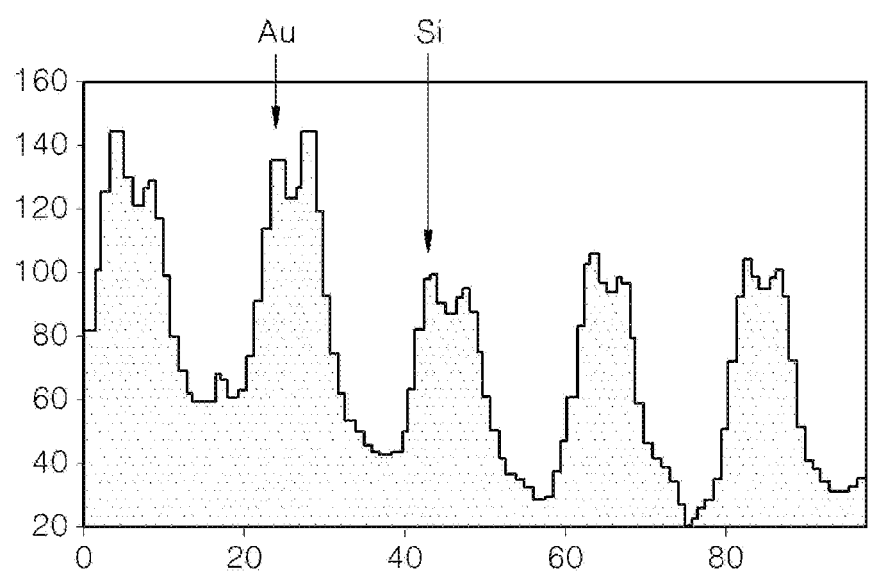
FIGS. 4B, 4C and 4D are graphs showing Si and Au atoms distinguished by differences of contrast intensities of a, b and c regions of FIG. 4A.
Figure 4C:
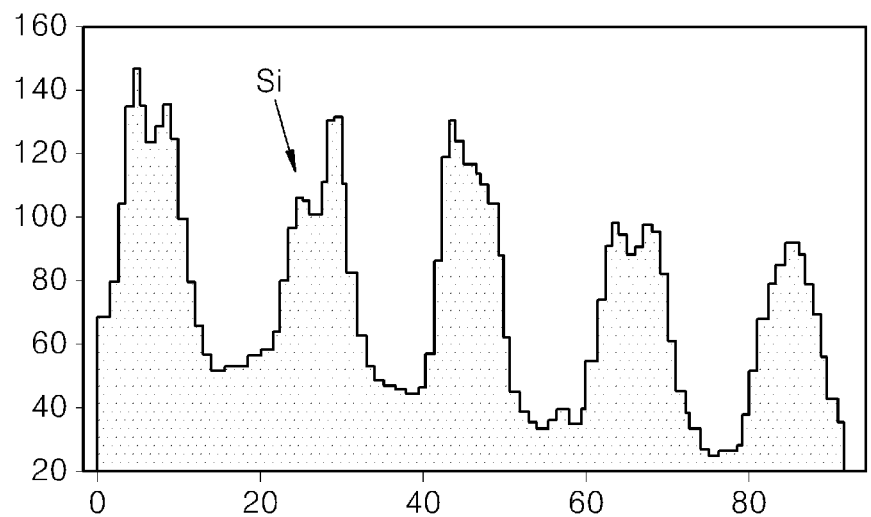
Figure 4D:
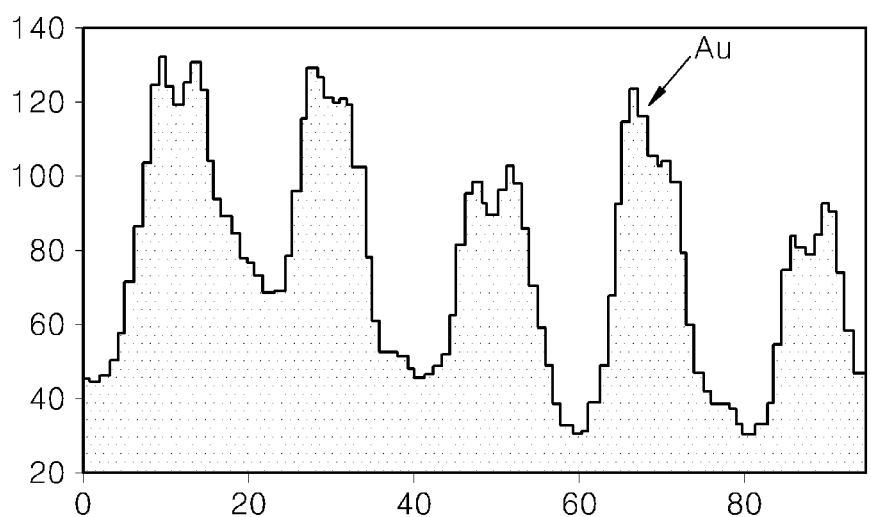

FIG. 4A is a high-resolution Z-contrast image showing a distribution of the Au nanoclusters on the surface of the silicon nanowire obtained in Example 1. FIGS. 4B through 4D show distributions of contrast intensities of regions a, b, and c of FIG. 4A. The graphs of FIGS. 4B through 4D show that Au exists in a high intensity position, and silicon atoms exist in a low intensity position. Accordingly, FIG. 4A shows an over-saturated structure in which Au atoms are substituted for silicon atoms existing on the surface of the silicon nanowire.

Figure 5:
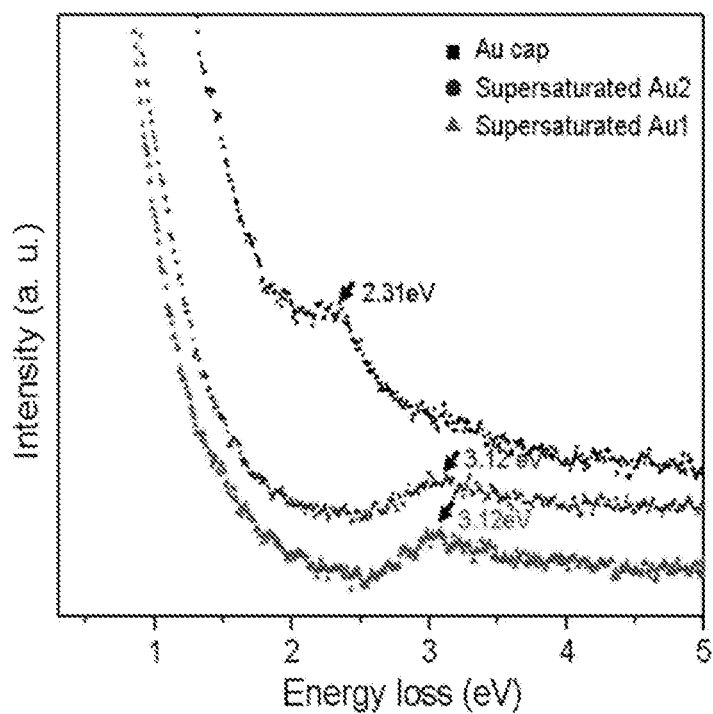
FIG. 5 is a graph showing Monochrome-EELS data obtained by measuring and comparing surface plasmon excitation energies of an Au cap and an Au nanocluster that exist in the silicon nanowire obtained the Example 1.

FIG. 5 is a graph showing a result obtained by measuring an optical characteristic of an Au cap existing on the upper end portion of the silicon nanowire obtained in Example 1 and an optical characteristic of the Au nanoclusters existing on the surface of the silicon nanowire. A surface plasmon resonance occurred at about 2.31 eV (537 nanometers) in the Au cap and occurred at about 3.12 eV (397 nanometers) in the Au nanoclusters.

Figure 6:
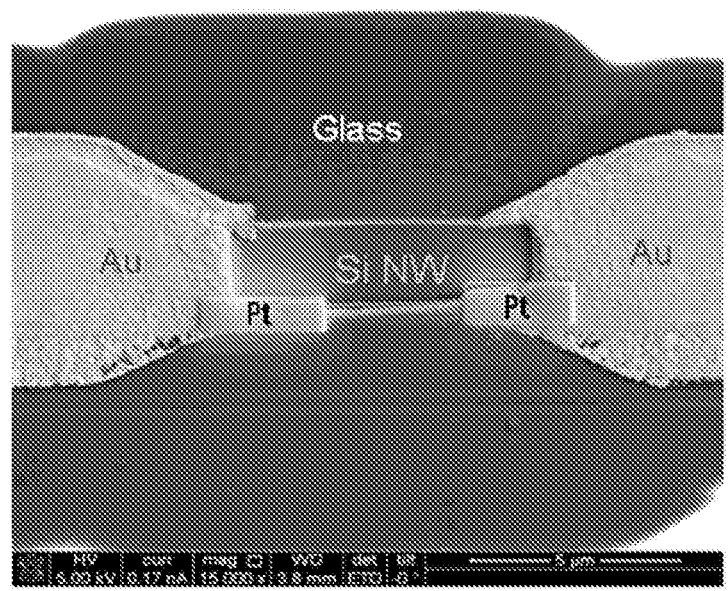
FIG. 6 is a SEM image of a nano-optical device manufactured using the silicon nanowire obtained in Example 1 and including the Au nanoclusters disposed on the surface thereof at a high density.

FIG. 6 is a SEM image of a nano-optical device manufactured using a principle in which resistance is decreased by a surface plasmon resonance effect of the Au nanoclusters, when light having a wavelength of about 397 nanometers is radiated onto the silicon nanowire of Example 1 including the Au nanoclusters. The nano-optical device is manufactured by forming two Au electrodes having a size of several tens of micrometers on a glass substrate, connecting the silicon nanowire of Example 1 including the Au nanoclusters in a bridge shape, and then covering the silicon nanowires, which exist in both the Au electrodes, with platinum (Pt).

Figure 7A:
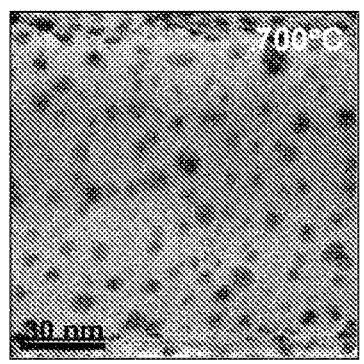
FIG. 7A is an enlarged image of a surface of the silicon nanowire obtained by performing a thermal treatment thereon at a temperature of 700° C., wherein the silicon nanowire obtained in Example 1 includes the Au nanoclusters disposed on the surface thereof at a high density.
Figure 7B:
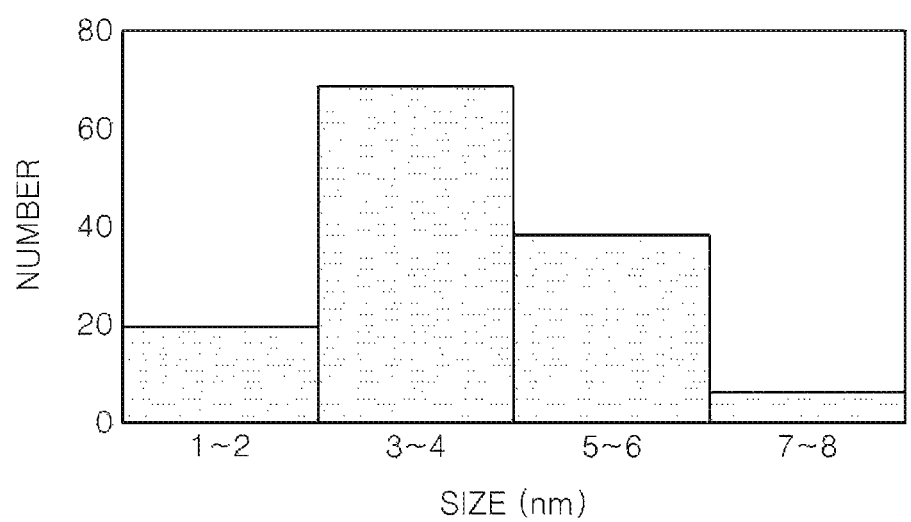
FIG. 7B is a graph showing a distribution of the Au nanoclusters according to its size.
Figure 8A:
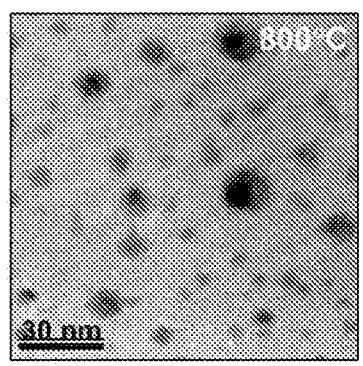
FIG. 8A is an enlarged image of a surface of the silicon nanowire obtained by performing a thermal treatment thereon at a temperature of 800° C., wherein the silicon nanowire obtained in Example 1 includes the Au nanoclusters disposed on the surface thereof at a high density.
Figure 8B:
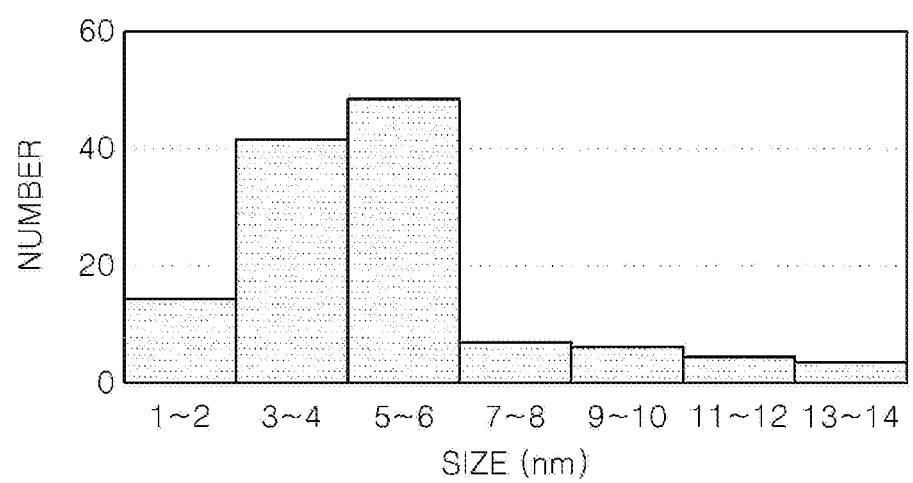
FIG. 8B is a graph showing a distribution of the Au nanoclusters according to the size of the nanoclusters.
Figure 9A:
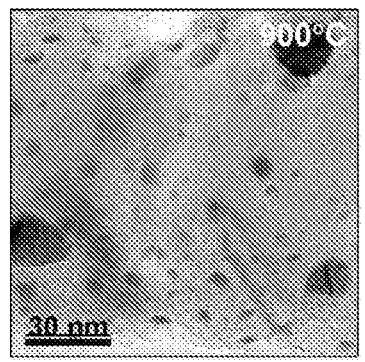
FIG. 9A is an enlarged image of a surface of the silicon nanowire obtained by performing a thermal treatment thereon at a temperature of 900° C., wherein the silicon nanowire obtained in the Example 1 includes the Au nanoclusters disposed on the surface thereof at a high density.
Figure 9B:
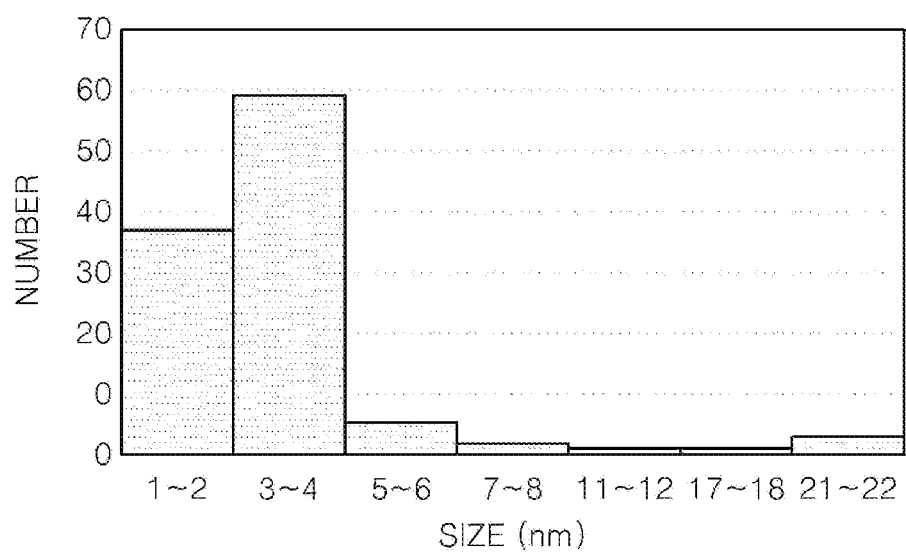
FIG. 9B is a graph showing a distribution of the Au nanoclusters according to its size.

FIGS. 7A, 8A and 9A are partial enlarged images of the Au nanoclusters obtained by respectively performing thermal treatments on silicon nanowires of Example 1 under a nitrogen atmosphere at temperatures of 700° C., 800° C. and 900° C., and FIGS. 7B, 8B and 9B are graphs showing distributions according to the size of the Au nanoclusters. The size of the Au nanoclusters may vary from about 1 to about 30 nanometers according to a temperature of the thermal treatment.

A silicon nanowire including metal nanoclusters according to embodiments of the present invention has improved electrical conductivity and optical characteristics, and thus the silicon nanowire can be used in various semiconductor devices that use a silicon nanowire.

Also, when Au or Ag having less toxicity is used as the metal nanoclusters, the metal nanoclusters can be used as a nano material appropriate for transfer of a bio material or for a bio sensor.

When the silicon nanowire including the metal nanoclusters is used in a lithium battery, the silicon nanowire has an excellent conductivity and has a structure in which deterioration of silicon due to charge/discharge may be reduced, and thus a lithium battery having an improved electrical characteristic can be manufactured.

Furthermore, the silicon nanowire including the metal nanoclusters can be used to manufacture an optical device, for example, a solar cell, having an excellent response signal time by using a surface plasmon resonance.

Charge trap characteristics of the metal nanoclusters included in the silicon nanowires are excellent, and the silicon nanowire prepared by a method according to the present invention is simple, when compared to a CTF flash memory manufactured by a conventional thin film manufacturing process.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A method of preparing a silicon nanowire, the method comprising:
    disposing a metal thin film layer on a silicon substrate;
    calcining in a first calcination process, the silicon substrate with the metal thin film layer disposed thereon in a hydrogen atmosphere to form metal silicon islands on the silicon substrate; and
    calcining in a second calcination process, the silicon substrate with the metal silicon islands disposed thereon in the presence of a mixed gas to grow the silicon nanowire comprising metal nanoclusters; where the metal nanoclusters are formed on a circumferential surface the silicon nanowire.

2. The method of claim 1, wherein the first calcination process is performed at a temperature of about 300 to about 1,000° C. and at a pressure of about 0.1 to about 500 Torr.

3. The method of claim 1, wherein the second calcination process is performed at a temperature of about 500 to about 600° C. and at a pressure of about 0.1 to about 10 Torr.

4. The method of claim 1, wherein the mixed gas is a mixture of $SiH_4$ and $H_2$.

5. The method of claim 1, wherein the metal nanoclusters comprises at least one metal selected from the group consisting of a transition metal, a lanthanide, a group 13 element with the exception of boron, and a group 14 element with the exception of carbon and silicon.

6. The method of claim 1, wherein the metal nanocluster comprises at least one metal selected from the group consisting of Au, Ni, Fe, Ag, Al, Ge, Gd, Cu, In, and Pb.

7. The method of claim 1, wherein the metal nanocluster comprises Au.

8. The method of claim 1, further comprising adjusting a size or density of the metal nanoclusters by preparing the silicon nanowire comprising the metal nanoclusters formed on the surface thereof and then additionally performing a thermal treatment on the silicon nanowire at a temperature of about 300 to about 1,000° C.

* * * * *